US009262319B2

(12) United States Patent
Ryan et al.

(10) Patent No.: US 9,262,319 B2
(45) Date of Patent: *Feb. 16, 2016

(54) ADUSTING FLASH MEMORY OPERATING PARAMETERS BASED ON HISTORICAL ANALYSIS OF MULTIPLE INDICATORS OF DEGRADATION

(71) Applicant: NATIONAL DIGITAL RESEARCH CENTRE LIMITED, Dublin (IE)

(72) Inventors: Conor Maurice Ryan, Limerick (IE); Joseph Sullivan, County Clare (IE)

(73) Assignee: NATIONAL DIGITAL RESEARCH CENTRE LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 14/623,405

(22) Filed: Feb. 16, 2015

(65) Prior Publication Data
US 2015/0161041 A1    Jun. 11, 2015

Related U.S. Application Data

(63) Continuation of application No. 13/497,569, filed on May 21, 2012, now Pat. No. 8,984,210.

(51) Int. Cl.
G11C 16/20     (2006.01)
G06F 12/02     (2006.01)
G11C 11/56     (2006.01)
G11C 16/34     (2006.01)

(52) U.S. Cl.
CPC ........ *G06F 12/0246* (2013.01); *G11C 11/5628* (2013.01); *G11C 16/349* (2013.01); *G06F 2212/7205* (2013.01)

(58) Field of Classification Search
CPC .... G11C 11/5628; G11C 16/20; G11C 16/34; G11C 16/349; G06F 12/0246
See application file for complete search history.

(56) References Cited

U.S. PATENT DOCUMENTS

2010/0082884 A1*  4/2010  Chen et al. .................... 711/103
2013/0246734 A1*  9/2013  Schaefer et al. .............. 711/206
2014/0122861 A1*  5/2014  El Maghraoui et al. ...... 713/100

* cited by examiner

Primary Examiner — John Lane
(74) Attorney, Agent, or Firm — Michael K. Bosworth; IPxLaw Group LLP

(57) ABSTRACT

The present invention is directed to a method for increasing the operational lifetime of a flash memory device, wherein, the method comprises varying the operating parameters of the flash memory device over the lifetime of the flash memory device. The advantage of providing a method which varies the operating parameters of a flash memory device is that the operational lifetime of the flash memory device will be increased. Relatively low voltages and relatively short voltage periods may be used initially to write to, read from and erase the flash cells in the flash memory device. As time passes, the flash cells in the flash memory device will begin to degrade and it will be necessary to increase the voltage and the period of the voltage applied to the flash memory device in order to ensure that the correct write, read and/or erase commands are carried out. The invention is also directed towards a flash memory device.

6 Claims, 2 Drawing Sheets

Figure 1:
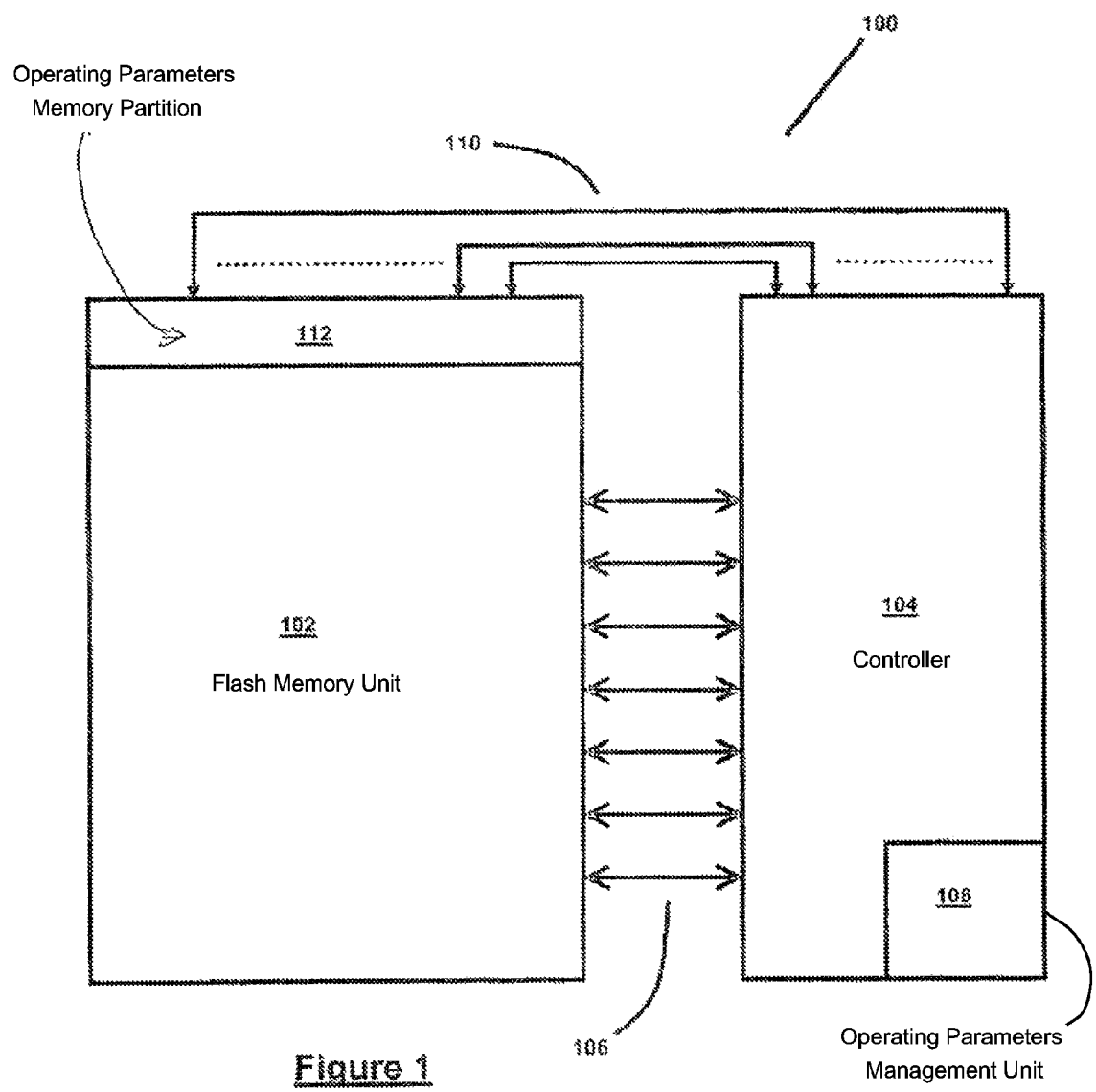

ADJUSTING FLASH MEMORY OPERATING PARAMETERS BASED ON HISTORICAL ANALYSIS OF MULTIPLE INDICATORS OF DEGRADATION

CROSS REFERENCE TO RELATED APPLICATIONS

This application is a continuation of U.S. patent application Ser. No. 13/497,569, filed on May 21, 2012, by Conor Maurice Ryan, et al. and entitled "System and Methods for Extending Operational Lifetime of Flash Memory".

INTRODUCTION

This invention relates to a method and apparatus for increasing the operational efficiency of flash memory devices and electronic units that use flash memory devices.

Solid-state drives (SSDs) have become increasingly commonplace in many electronic units over the past number of years. The majority of these SSDs use flash memory devices in order to store data.

Flash memory devices typically comprise floating-gate field effect transistors (FETs) as their storage element which may implement NOR flash memory and/or NAND flash memory. A floating-gate FET comprises a second, floating gate in addition to the normal gate found in the FET. By setting the electronic charge on the floating gate of the FET, the threshold voltage (VT) of the FET can be altered to reflect a binary '1' or a binary '0' in a single level flash cell, or, more complex binary values in multi-level flash cells (MLCs).

The flash memory devices are arranged in blocks, with each block comprising a plurality of pages, and each page comprising a plurality of bytes. Usually, a page comprises 512, 2048 or 4096 bytes. In some case, the page may comprise an even greater more of bytes.

An electrical stimulus, which is set with regard to operating parameters of the flash memory device, is applied to the flash memory device to set the binary value in the flash memory device.

The operating parameters of a flash memory device may comprise one or more of a read voltage level, a write voltage level, an erase voltage level, a read current level, a write current level, an erase current level, a read voltage duration, a write voltage duration, an erase voltage duration, a threshold current, a threshold voltage, a rate of increase of current and voltages, a number of repeated cycles of application of current and voltages for a single program operation or erase operation, a rate of change of currents and voltages during the repeated cycles, a size of steps taken during repeat cycles and/or a pass voltage.

Voltages used in flash memory devices vary in the range of almost 0V to 35V. Current used in flash memory devices vary in the range of a few micro amps to less then 100 milliamps. The number of repeat cycles typically varies from 1 cycle to 20 cycles.

Each of the operating parameters are instantiated by control registers values, or part of a control register value. The control register is a physical piece of memory typically containing eight bits, which encode the operating parameters.

Therefore, throughout the following specification, any reference to operating parameters should be understood to refer to the value stored in the control register. References to the electrical stimulus shall be understood to refer to the actual electrical signals applied to the flash memory device.

A flash memory drive or flash memory unit may contain one or more flash memory devices.

One of the problems with flash memory devices is that the floating-gate FETs degrade over time with every program operation, such as a read operation or a write operation, and, also with every erase operation which is carried out on the flash memory device.

After each operation, the structure of the storage element in the floating-gate FETs can become eroded making the floating-gate FET less efficient at changing state between a binary '1' and a binary '0'.

The amount of degradation caused to the floating-gate FET on each occasion is proportional to the current levels, voltage levels and the exposure times of the current and voltage levels on the floating-gate FET. The electrical stimulus on the floating-gate FET, the number of repetitions of the electrical stimulus on the floating-gate FET and the rate of change of the electrical stimulus on the floating-gate FET are all factors which are used to perform write and/or erase operations on the floating-gate FETs used in the flash memory device, and consequently are all factors in the degradation levels of the floating gate FETs.

Another problem which currently affects the flash memory devices is that an electrical charge, in the form of implanted electrons, remains in an insulating oxide portion of the floating-gate FET of the flash memory device. This electrical charge obstructs the flow of electrons on and off the insulating oxide portion the floating-gate FET, thus making the floating-gate FET progressively more reluctant to change state between binary '1' and binary '0'. This electrical charge increases such a time as the flash memory device cannot be programmed or erased reliably.

Yet a further problem with the flash memory devices is leakage of electrical charge from the floating gate of the floating-gate FET over time. It is important to ensure that enough charge is placed on the floating gate, such that the floating-gate FET will remain set in the same logic state for a prescribed period of time, known as a retention period. This retention period is typically between 3 months to 10 years depending on the intended application of the flash memory device. Over time, electrical charge placed on the floating gate will leak off the electrically isolated gate and the rate at which the charge leaks off the floating gate will, in part, determine the operational lifetime of the flash memory device.

The above mentioned problems reduced the operational efficiency of flash memory devices and a solution has been long since sought to overcome these problems. The flash memory devices have a finite operational lifetime as a result of these problems, and typically, this operational lifetime is up to 100,000 program and/or erase operations for single level cells, or up to 10,000 program and/or erase operations for MLCs.

Thus, the amount of electrical stimulus, and oxide degradation which is associated with that electrical stimulus, that is used to place and extract quantities of electrons onto and from the floating gate of the flash memory device has to be balanced against the ability of the flash memory device to retain those electrons for the above-mentioned retention period in order to provide a flash memory device which is as operationally efficient as possible.

If particularly high operating parameters are used for a long period of time, implantation occurs relatively quickly and thus the degradation of the flash memory device will occur relatively quickly in comparison to flash memory devices that use operating parameters having lower electrical stimulus levels.

Alternatively, if low currents or voltages are set as the operating parameters, then the flash memory will quickly become unusable as even the smallest amount of degradation to the flash cells will make it very difficult for the flash memory to be correctly written to or read from using the low current or voltage signals. Furthermore, low levels of charge on the floating gate may cause the data retention to be relatively short as the charge leaks from the insulated floating gate over time. If a low level of charge is used on the floating gate, the data retention will be relatively short and the operational lifetime of the flash memory device will be significantly reduced.

The role of a design engineer in choosing the operational parameters for a flash memory device is therefore very important if a good balance is to be achieved. However, at present the setting of the operating parameters for the flash memory devices is not a highly scientific process. Typically, the design engineer will use a set of operating parameters that have been found to be appropriate in previous batches of flash memory devices that have been manufactured. As the design engineer is not a way of how the flash memory devices will be deployed, a 'middle of the road' approach is taken when choosing the operating parameters. Clearly, in certain situations depending on the operations performed by the flash memory devices, this may not be the correct approach.

Due to manufacturing process variations, material variations and the like, a generic set of operating parameters will not be ideally suited to all batches of flash memory devices. In other words a generic operating parameter set will not be ideally suited to any particular batch of flash memory devices in order to fully exploit that particular batch of flash memory devices. Each batch of flash memory devices will have a potential for longevity which is based on that batch's intrinsic endurance and retention characteristics.

Basing the choice of the operating parameters on historical data from previously manufactured batches of flash memory devices is not wholly reliable and can lead to accelerated degradation of the flash memory devices and consequently a shorter operational lifetime for that flash memory device.

Furthermore, as the operating parameters are set at the time of manufacture of the flash memory devices, the operating parameters are unlikely to be ideally suited to each flash memory device during all of the stages of the flash memory device's operational lifetime. This is due to the implantation and degradation progresses which alter the behaviour of the flash memory devise and resultantly some or all of the operating parameters are no longer ideal.

The rate of degradation of a flash memory device is heavily dependent on the type of application that the flash memory device experiences. For example, a flash memory device used within a memory stick can expect to encounter less state changes, and so does not require a large endurance level, but will experience a relatively large number of periods of power down, and thus require good retention times. On the contrary, a flash memory device used within an enterprise storage array will experience substantially the opposite—frequent state changes but few power down periods.

At present, it is known to use wear-levelling techniques so that the flash memory devices in the flash memory drives are evenly degraded over time. A software routine in the electronic unit which comprises the flash memory devices, or, the flash memory drive itself keeps track of which flash memory devices have been used and manages the reading and writing of data to and from the flash memory devices so that all of the flash memory devices are read from and written to in substantially equal amounts when compared with one another. In this manner, the overall operating lifetime of the flash memory device can be increased as the effects of the degradation of the read/write operations are spread across all of the flash cells in the flash memory device.

Whilst this solution is advantageous, there are still problems since this arrangement does not attempt to stem the wear-out and degradation of the flash memory devices, but rather tries to deploy the wear-out and degradation evenly. The controllers make no attempt to modify operating parameters via the control registers over the operational lifetime of the flash memory device nor do the controllers attempt to compensate for the different operating functions which the flash memory devices will experience.

It is also known for a flash memory device to allow the electrical stimulus levels to be changed over the lifetime of a floating-gate FET; however, the operating parameters are not altered. That is to say, a floating-gate FET may have an operating parameter for a maximum number of repeat cycles for writing to a flash memory device. If the flash memory device has not been successfully written to within that maximum number of repeat cycles, then the flash memory device may be flagged as inoperable and a different flash memory device on the flash memory drive is selected to be written to. At the beginning of the lifetime of a floating-gate FET, although the maximum repeat cycle value stored in the control register may be 15, only 5 attempts may be carried out. As the floating-gate FET becomes older, the number of attempts that are carried out increase up to the maximum number as defined by the operating parameter in the control register. In this manner, it is clear that the electrical stimulus may be increased as a flash memory device becomes older, however, the operating parameters do not change. Thus, while the electrical stimulus between subsequent programming and/or erasing operations may be altered, the registers values never change. The operating parameters are calculated at the flash memory device manufacturing plant, instantiated at the flash memory device manufacturing plant and do not change over the lifetime of the flash memory devices. Heretofore, the operating parameters have been considered as sacrosanct and fixed subsequent to the initial setting of the parameters at the time of manufacture. The variance in the electrical stimulus applied to the floating-gate FET is always limited to upper and/or lower thresholds set by the operating parameters of the floating-gate FET.

The flash memory devices will ultimately degrade due to the coarse nature of the read/write operations that are performed upon them.

It is a goal of the present invention to provide an apparatus/method that overcomes at least one of the above mentioned problems, and increases the operating lifetime of a flash memory device, thus increasing the operational lifetime of an electrical unit comprising the flash memory devices.

SUMMARY OF THE INVENTION

The present invention is directed to a method for increasing the operational lifetime of a flash memory device, wherein, the method comprises the step of adjusting an operating parameter of the flash memory device over the lifetime of the flash memory device.

The advantage of providing a method which varies the operating parameters or the parameter values in one or more operating registers of a flash memory device is that the operational efficiency of the flash memory device will be increased. Relatively low electrical stimuli may be used initially to write to, read from and erase the flash cells in the flash memory device. As state changes occur over time, the flash cells in the flash memory device will begin to degrade and it will be necessary to move thresholds and/or increase the electrical stimuli applied to the flash memory device in order to ensure that adequate write, read and/or erase commands are carried out. Essentially, the present invention varies the operating parameters by changing the corresponding register value over the operating lifetime of the flash memory device.

Heretofore, though nobody has considered adjusting the operating parameters, which are fixed in the control registers, in order to improve the operational efficiency of flash memory devices. The operational parameters have always been seen as sacrosanct and are not easily adjustable under normal operation of the floating-gate FETs. Normally, a testing mode must be entered into an order to allow the operating parameters of the floating-gate FETs to be adjusted. This is a strong indication of how sacrosanct and fixed the operating parameters of a floating-gate FET, and flash memory devices in general, were considered to be in the prior art. The realisation that the operating parameters of a flash memory device could be adjusted in a dynamic manner in order to improve the efficiency of the flash memory device, and allow the flash memory device to operate more efficiently under a greater number of conditions is seen as an important step in the present invention.

The present invention is also directed to a method for increasing the operational efficiency of a flash memory device, wherein, a value held in a control register which determines an operating parameter of the flash memory device is adjusted over the lifetime of the flash memory device.

The advantage of providing a method which varies the operating parameters or the parameter values in one or more operating registers of a flash memory device is that the operational efficiency of the flash memory device will be increased. Operational efficiency includes the operational lifetime, the operational requirement such as voltage and current requirements for program and erase operations; and, the operational efficiency will be different for different flash memory devices dependant on how the flash memory device is deployed.

In a further embodiment, the operating parameter of the flash memory device is adjusted on multiple occasions over the lifetime of the flash memory device.

In a further embodiment, the value held in the control register is adjusted on multiple occasions over the lifetime of the flash memory device.

In a further embodiment, the value held in the control register is increased over the lifetime of the flash memory device.

In a further embodiment, the method further comprises a step of calibrating the flash memory device during a manufacturing stage by selecting an optimum set of operating parameters for the flash memory device from a plurality of different sets of operating parameters based on testing the flash memory device.

In a further embodiment, the testing in the step of calibrating the flash memory device during the manufacturing stage is carried out on one or more pre-specified bad blocks within the flash memory device. The bad blocks are pre-specified as such by the manufacturer at the time of manufacture.

In a further embodiment, the method further comprises the step of tracking an operating age of the flash memory device and adjusting an operating parameter of the flash memory device in response to the tracked operating age of the flash memory device.

In a further embodiment, the method further comprises the step of analysing the type of operations performed by the flash memory device over a preset time period, and adjusting an operating parameter of the flash memory device in response to the analysis.

In a further embodiment, the method is carried out by placing the flash memory device into a test mode in order to calibrate, adjust and/or adapt an operating parameter of the flash memory device.

In a further embodiment, the method further comprises analysing a specific batch of flash memory devices to ascertain operating parameters that are ideally suited to that particular batch of flash memory devices.

In a further embodiment, the method further comprises modifying an operating parameter in order to adjust one or more thresholds of a logic level in the flash memory device over the lifetime of the flash memory device.

The present invention is further directed towards a flash memory device comprising an array of memory blocks and a controller, wherein, the controller is used to manage write and erase operations on the array of memory blocks; whereby, the controller comprises an operating parameters management unit which is used to vary an operating parameter of the memory blocks in the flash memory device over the lifetime of the flash memory device.

The advantage of providing a method which varies the operating parameters or the parameter values in one or more operating registers of a flash memory device is that the operational efficiency of the flash memory device will be increased.

In a further embodiment, a value held in a control register which determines an operating parameter of the flash memory device is adjusted over the lifetime of the flash memory device.

In a further embodiment, the operating parameter of the flash memory device is adjusted on multiple occasions over the lifetime of the flash memory device.

In a further embodiment, the value held in the control register is adjusted on multiple occasions over the lifetime of the flash memory device.

In a further embodiment, the value held in the control register is increased over the lifetime of the flash memory device.

In a further embodiment, the flash memory device is calibrated during manufacture by selecting an optimum set of operating parameters for the flash memory device from a plurality of different sets of operating parameters based on testing the flash memory device.

In a further embodiment, the testing of the flash memory device is carried out on one or more pre-specified bad blocks within the flash memory device. The bad blocks are pre-specified as such by the manufacturer of the bad blocks.

In a further embodiment, the controller tracks an operating age of the flash memory device and adjusts an operating parameter of the flash memory device in response to the tracked operating age of the flash memory device.

In a further embodiment, the controller analyses the type of operations performed by the flash memory device over a preset time period, and adjusts an operating parameter of the flash memory device in response to the analysis.

In a further embodiment, the flash memory device is placed into a test mode in order to calibrate, adjust and/or adapt an operating parameter of the flash memory device.

In a further embodiment, a specific batch of flash memory devices are analysed to ascertain operating parameters that are ideally suited to that particular batch of flash memory devices.

In a further embodiment, the controller modifies an operating parameter in order to adjust one or more thresholds of a logic level in the flash memory device over the lifetime of the flash memory device.

In a further embodiment, the operating parameter comprises one or more of a program current, a program voltage, an erase current, an erase voltage, a number of repeat cycles and a rate of repeat cycles for a performing a programme and/or erase operation, a threshold voltage, a threshold current and a pass threshold.

In a further embodiment, a first communications link is established between the array of memory blocks and the controller for managing write and erase operations, and a second separate communications link is established between the array of memory blocks and the controller for varying the operating parameters of the memory blocks in the flash memory device.

DETAILED DESCRIPTION OF EMBODIMENTS

Figure 2:
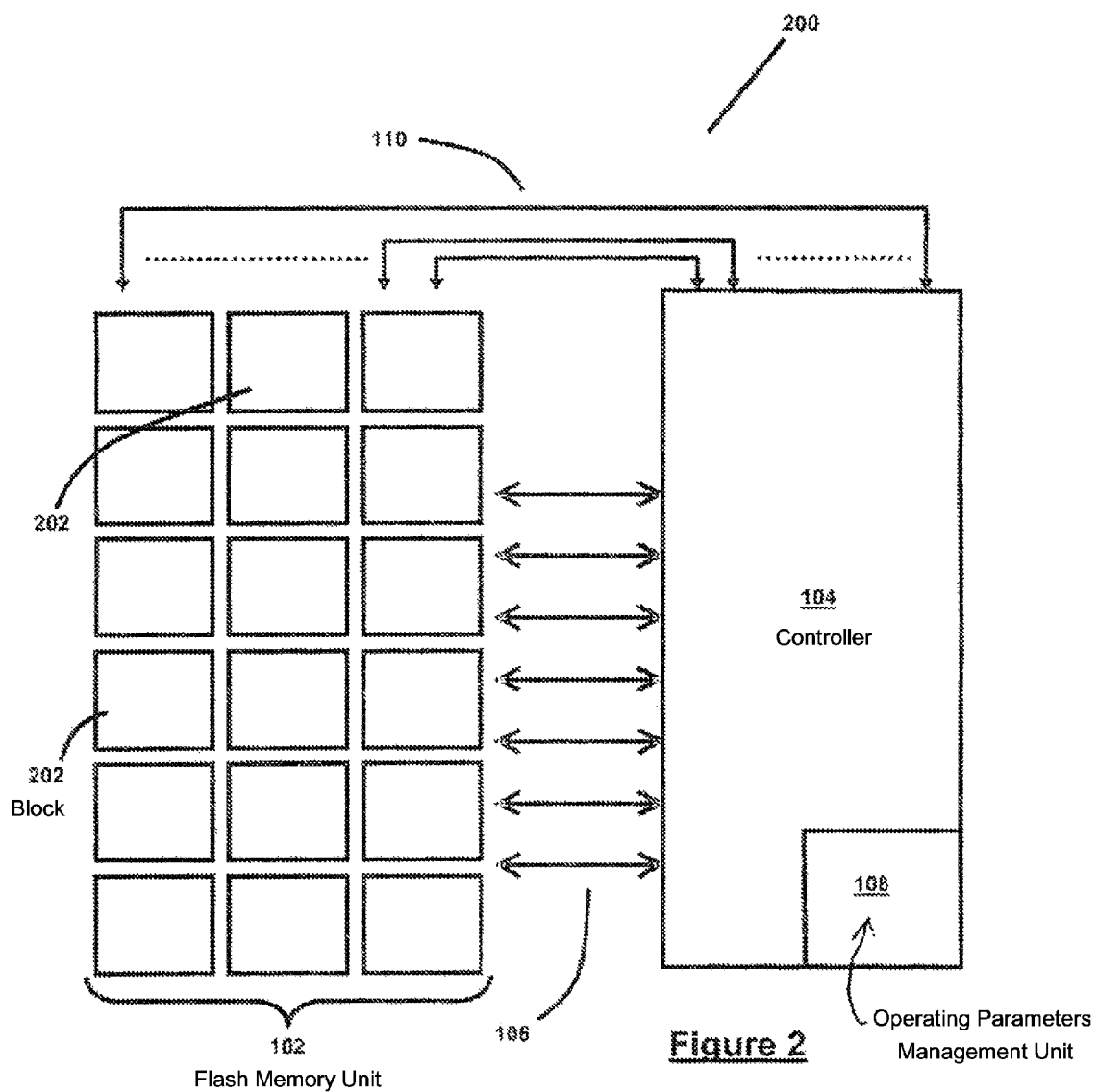

The invention will be more clearly understood from the following description of some embodiments thereof, given by way of example only with reference to the accompanying drawings, in which:

FIG. 1 is a diagrammatic representation of a flash memory device in accordance with the present invention; and, FIG. 2 is a diagrammatic representation of a further embodiment of a flash memory device in accordance with the present invention.

Referring to FIG. 1, there is provided a flash memory device indicated generally by the reference numeral 100. The flash memory device 100 comprises a flash memory unit 102 and a corresponding controller 104. The controller 104 is used to manage the read, write and/or erase operations on the flash memory unit 102. Algorithms for controlling the flash memory device are stored on the controller 104. The management signals transmitted between the flash memory 102 and the controller 104 are transmitted over a plurality of communications links 106.

A portion of the controller memory is set aside to act as the operating parameters management unit 108. The operating parameters management unit 108 transmits and receives signals from the flash memory unit 102 over a communications link 110 which may be dedicated or multiplexed. The operating parameters management unit 108 will set the voltage levels and voltage periods required to write to the flash memory unit 102, read from the flash memory unit 102 and/or erase at least a portion of the flash memory unit 102. The operating parameters management unit 108 will receive information from the flash memory unit 102 and/or the controller 104 relating to the type of operations that are being carried out on the flash memory unit 102.

For example, if the flash memory unit 102 is being used as a long-term data storage unit, then the vast majority of the operations carried out will be read and write operations. It will be rare that the erase operation will be carried out and consequently this will effect the type of degradation that the flash memory unit 102 sufferers. Therefore, the operating parameters of the flash memory unit 102 may be adjusted in response to the manner in which the flash memory unit 102 is being employed, and specifically to the type of degradation that the flash memory device 100 is being subjected to.

Similarly, in addition to or in replacement of this type of flash memory management, the operating parameters management unit 108 may also be used to keep track of the operating age of the flash memory unit 102. As the operating age of the flash memory unit 102 increases, the operating parameters used in conjunction with the flash memory unit 102 may be varied to take account of the naturally occurring degradation due to the age of the flash memory unit 102.

The operating parameters management unit 108 may also be used to calibrate the flash memory unit 102 during manufacture of the flash memory device 100 and hence the management unit or portion thereof may reside inside an industrial component tester.

The calibration of the flash memory unit 102 is carried out by performing a number of read, write and erase operations on the flash memory unit 102 to assess what the optimal operating parameters for that particular flash memory unit 102 would be. It is envisaged in a preferred embodiment, that a plurality of different sets of operating parameters would be created, and the optimum set of operating parameters is selected from this plurality of different sets of operating parameters. Thus, the specific intricacies and variations that occur in individual batches of flash memory devices may be accounted for by using this initial calibration technique. In a further preferred embodiment, the calibration of the flash memory device 100 is carried out by testing pre-specified portions of the flash memory unit 102 which have already been specified as damaged or bad portions of the flash memory unit 102 by the manufacturer.

The choice of the optimum set of operating parameters selected from the plurality of different sets of operating parameters is carried out by using one or more of a machine learning algorithm, such as a genetic algorithm or a simulated annealing and/or evolutionary strategy, generation of mathematical models based on the parameter sets generated by automated ways, and/or manual analysis of the models, associated specification sheets for components used in the flash memory design and manufacture and results garnered from the above mentioned machine learning algorithms.

The operating parameters of the flash memory unit 102 may be stored in operating parameters memory partition 112.

With reference to FIG. 2, wherein like parts previously described have been assigned the same reference numerals, there is provided a further embodiment of a flash memory device 200. The flash memory device 200 comprises a flash memory unit 102 and an associated controller 104. The controller 104 is in communication with the flash memory unit 102 via a communications link 106. A portion of the controller 104 is assigned to be an operating parameters management unit 108 for managing the operating parameters of the flash memory unit 102. The operating parameters management unit 108 communicate with the flash memory unit 102 via a communications link 110, which may be dedicated or multiplexed.

The flash memory unit 102 comprises a plurality of blocks 202. Each block 202 is comprised of a variety of pages (not shown), which in turn are comprised of a plurality of bytes (not shown).

As described above, the operating parameters management unit 108 is used to initially set the operating parameters of the flash memory unit 102 by performing a calibration. It is envisaged that this calibration will be done at the manufacturing stage. However, it will be appreciated that the calibration and indeed re-calibrations may be performed at later stages during the operating lifetime of the flash memory device 200. The operating parameters management unit 108 may also be used to automatically adjust the operating parameters in respect of the operating age of the flash memory device 200, and in respect of the type of operations that are being commonly performed on the flash memory device 200.

An analysis unit (not shown) is envisaged to form part of the operating parameters management unit 108 and will analyse the type of operations and the frequency of the operations that had been performed on the flash memory unit 102. A library of historical data may be generated in this manner and the operating parameters of the flash memory unit 102 can be adjusted taking cognisance of this library of historical data, while also taking cognisance of the operational role and conditions of the flash memory device 100. For example, if the flash memory device 100 is primarily used as portable memory, it is likely that there will be few program and erase operations, but the flash memory will be expected to retain the binary status for a relatively long period of time. Thus, the flash memory device 100 can expect to encounter less state changes, and a such does not require strong endurance characteristics to counter the oxide degradation and implantation, but will experience a relatively large number of periods of power down, and thus requires good retention times to counter the leakage of electrical charge from the isolated floating gate. Conversely, if the flash memory device 100 is primarily used as memory in a computing array, the flash memory device 100 will experience frequent state changes as data is constantly written to and erased from the flash memory unit 102. Therefore, this flash memory device 100 should be calibrated and set up to be quite resilient to the oxide degradation and implantation which will occur. However, the flash memory device 100 is unlikely to be required to store data during long down periods and therefore the flash memory device 100 does not need to counter the effects of the leakage of electrical charge from the isolated floating gate as much as a flash memory device 100 in a memory stick.

It will be understood that there are various manners in which the operating parameters management unit 108 may be embodied by using the memory and processing power of external units that have not been described here in the specification. For example, if the flash memory device 100, 200 was to be used in a mobile telephone device, then it is possible that the processor and/or memory resources of the mobile telephone device could be used to provide the operating parameters management unit 108. In the case that the flash memory device 100, 200 was provided for in any USB flash key, then it is likely that the operating parameters management unit 108 would form part of the communications and data controller 104 as is commonly found in flash memory devices 100.

In addition to the calibration, re-calibration and adjustments in respect of operating age and/or adaptation in respect of the type of operations being performed on the flash memory device, it is further envisaged that the operating parameters of the flash memory device 100, 200 will be varied in respect to other indicators which detail the level of degradation of the electronic components used in the flash memory device 100, 200.

It will be understood that any references here and before to the lifetime of a flash memory device, or indeed any non-volatile memory device, shall be understood to refer to the number of program and/or erase operation cycles that may be applied to the memory device prior to the failure of that memory device. The failure of the memory device should be understood as the inability of the device to correctly and consistently retain and indicate the previously set bit charge level.

Definition of flash memory device in this specification understood to refer to NAND type flash memory devices, and more generally to non-volatile memory devices.

The terms "comprise" and "include" and any variations thereof required for grammatical reasons are to be considered as used interchangeable and accorded the widest possible interpretation.

The invention is not limited to the embodiments hereinbefore described which may be varied in both construction and detail within the scope of the appended claims.

The invention claimed is:

1. A flash memory drive comprising:
   (a) one or more flash memory chips, each of which includes an array of flash memory blocks and a memory partition containing operating parameter values;
   (b) a controller, external to the one or more flash memory chips, that issues read, write and erase commands to the flash memory chips during the operational lifetime of the flash memory drive, wherein
      (i) each of the flash memory chips implements the commands by applying varying levels of electrical stimuli to the flash memory blocks in accordance with current values of the operating parameters stored in that flash memory chip; and
      (ii) the controller includes an operating parameters management unit that, over time during the operational lifetime of the flash memory drive, (1) generates a library of historical data based upon an analysis of a plurality of indicators of a current level of degradation of one or more of the flash memory blocks, wherein the plurality of indicators includes the type and frequency of operations performed on the flash memory blocks, as well as a cumulative number of program/erase cycles, and (2) modifies the values of one or more of the operating parameters stored in each flash memory chip based upon the library of historical data.

2. The flash memory drive of claim 1, wherein the plurality of indicators includes the frequency of read operations.

3. The flash memory device of claim 1, wherein the controller increases the values of one or more of the operating parameters on multiple occasions during the operational lifetime of the flash memory drive.

4. A method for increasing the operational lifetime of a flash memory drive that includes a controller and one or more flash memory chips, each chip having an array of flash memory blocks and a memory partition containing operating parameter values, the method including the following steps performed during the operational lifetime of the flash memory drive:
   (a) issuing controller-generated read, write and erase commands;
   (b) implementing the commands in each chip by applying varying levels of electrical stimuli to the flash memory blocks in accordance with current values of the operating parameters stored in that flash memory chip;
   (c) generating over time a library of historical data based upon an analysis of a plurality of indicators of a current level of degradation of one or more of the flash memory blocks, wherein the plurality of indicators includes the type and frequency of operations performed on the flash memory blocks, as well as a cumulative number of program/erase cycles; and
   (d) modifying the values of one or more of the operating parameters stored in each flash memory chip based upon the library of historical data.

5. The method of claim 4, wherein the plurality of indicators includes the frequency of read operations.

6. The method of claim 4, wherein the values of one or more of the operating parameters are increased on multiple occasions during the operational lifetime of the flash memory drive.

* * * * *